(12) United States Patent
Moradian et al.

(10) Patent No.: US 11,162,168 B2
(45) Date of Patent: Nov. 2, 2021

(54) SUBSTRATE POSITIONING APPARATUS AND METHODS

(71) Applicant: Applied Materials, Inc., Santa Clara, CA (US)

(72) Inventors: Ala Moradian, Sunnyvale, CA (US); Travis Tesch, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 112 days.

(21) Appl. No.: 16/512,699

(22) Filed: Jul. 16, 2019

(65) Prior Publication Data

US 2020/0024726 A1 Jan. 23, 2020

Related U.S. Application Data

(60) Provisional application No. 62/701,268, filed on Jul. 20, 2018.

(51) Int. Cl.
*C23C 14/54* (2006.01)
*C23C 14/56* (2006.01)
*G01B 11/30* (2006.01)

(52) U.S. Cl.
CPC ............ *C23C 14/54* (2013.01); *C23C 14/562* (2013.01); *C23C 14/566* (2013.01); *G01B 11/303* (2013.01); *G01B 2210/56* (2013.01)

(58) Field of Classification Search
CPC combination set(s) only.
See application file for complete search history.

(56) References Cited

U.S. PATENT DOCUMENTS

| 8,314,371 | B2 | 11/2012 | Sorabji et al. | |
|---|---|---|---|---|
| 2004/0067127 | A1 | 4/2004 | Hofmeister | |
| 2014/0320865 | A1* | 10/2014 | Knuttel | G01B 9/02007 356/495 |
| 2016/0011499 | A1* | 1/2016 | Hassan | G08B 31/00 430/5 |
| 2017/0115555 | A1 | 4/2017 | Hofmann et al. | |
| 2018/0031964 | A1* | 2/2018 | Jindal | G03F 1/24 |
| 2018/0068881 | A1* | 3/2018 | Cavins | H01L 21/67766 |

FOREIGN PATENT DOCUMENTS

KR 20070070435 A 7/2007

OTHER PUBLICATIONS

PCT International Search Report and Written Opinion in PCT/US2019/042145 dated Nov. 5, 2019, 13 pages.

* cited by examiner

*Primary Examiner* — Kyle O Logan
(74) *Attorney, Agent, or Firm* — Servilla Whitney LLC

(57) ABSTRACT

Described herein are apparatus and methods used to process a substrate in a chamber, in particular to position a non-round substrate in a holding chamber or a processing chamber. Further described herein are a 3D mapping device that is configured to measure the surface profile of a non-round substrate and a position of the substrate on the robot arm.

19 Claims, 9 Drawing Sheets

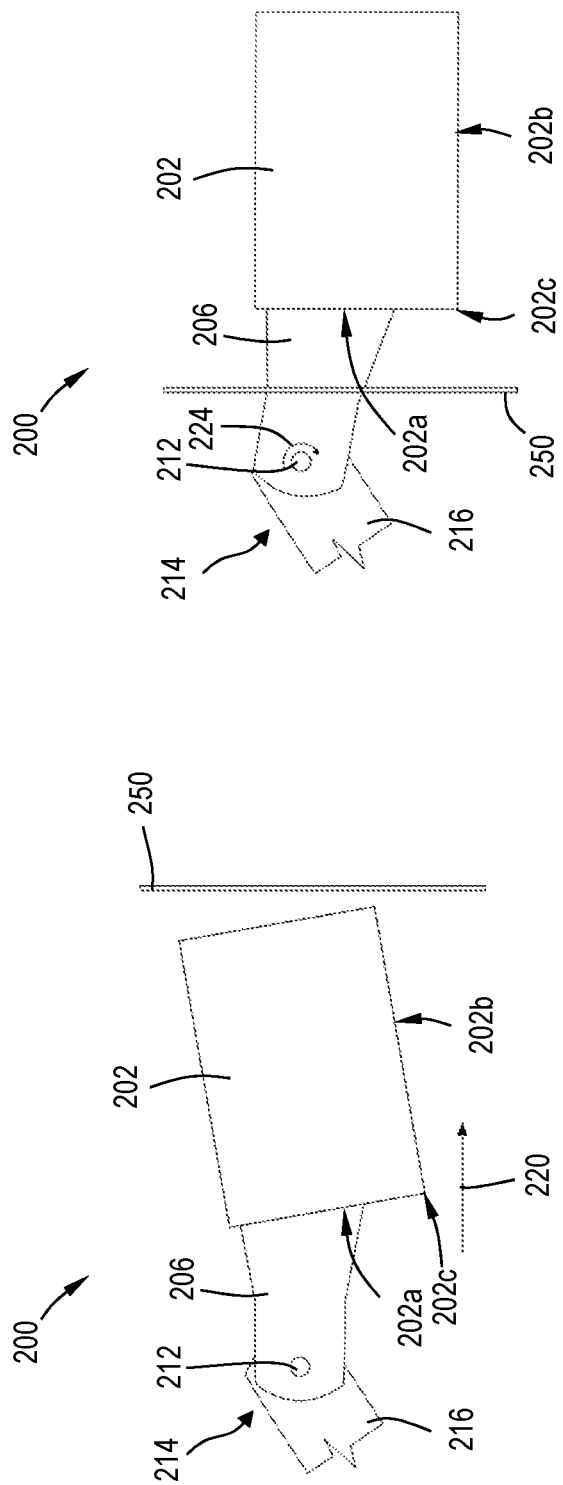
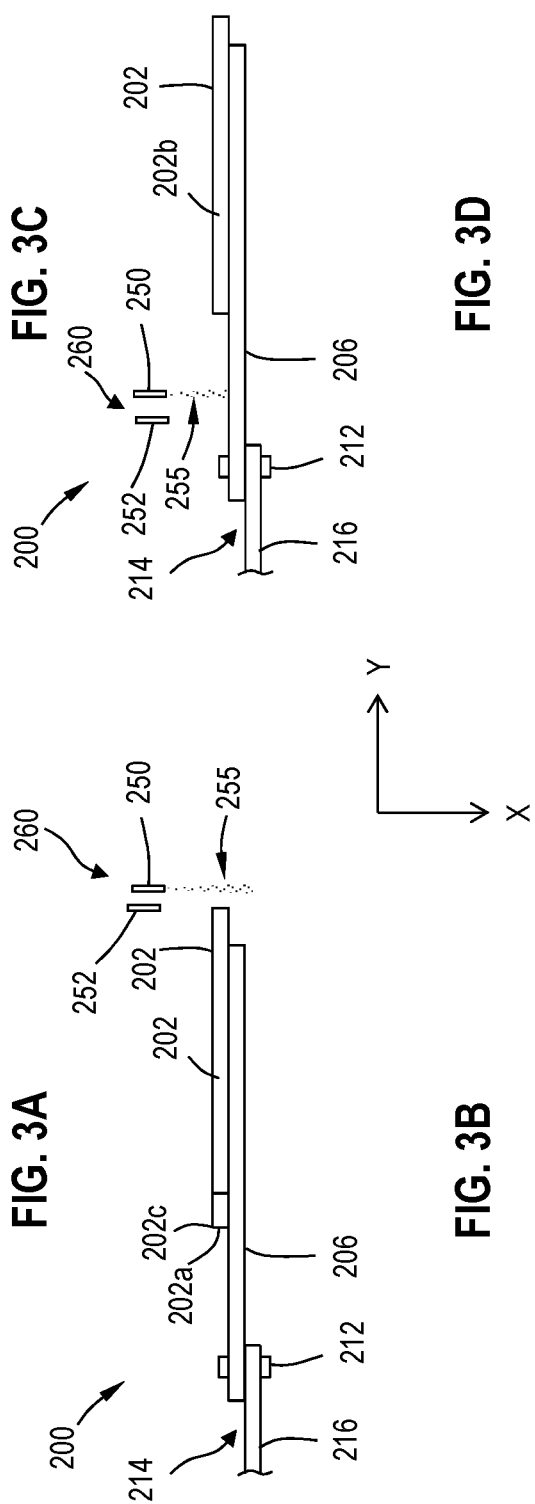
FIG. 3C
FIG. 3D
FIG. 3A
FIG. 3B

SUBSTRATE POSITIONING APPARATUS AND METHODS

TECHNICAL FIELD

Embodiments of the present disclosure relate generally to processing and aligning workpieces such as substrates and, more specifically, to an apparatus and a method for processing workpieces utilizing a positioning apparatus.

BACKGROUND

Integrated circuits are manufactured by processes which involve placement of substrates in chambers including holding or "load lock" chambers and a variety of substrate processing chambers, including, but not limited to deposition chambers, thermal processing chambers, etching chambers, plasma chambers, and other chambers to process a substrate. More than one process may be performed in one chamber. For example, plasma processing, thermal processing and etching may be performed in a single chamber or separate chambers. In many semiconductor processing systems, substrates are supplied to chambers by one or more front opening unified pods (FOUPs) including robotic arms or robot arms. Processing of substrates such as producing patterned material on a substrate requires controlled methods for deposition and removal of exposed material. Before deposition and removal, however, accurate placement of the substrate is an important aspect of process control.

Due to several reasons, such as variations in substrate placement in a FOUP, substrate placement in processing chambers and consistency and repeatability of wafer transfer from robot arms, substrates are not exactly picked and placed similarly. Therefore, there is a possibility that different substrates are not placed exactly at the same position in a process chamber. This can affect yield performance for processes sensitive to slight variation in flow condition, line of sight, or other process-significant physics or chemistry.

Traditionally, detecting a center (or an edge) of a round silicon substrate (also called a wafer) involves using a series of light emitting didoes and sensors, where the wafer blocks the path of light emitted from some of the emitting diodes. This approach can be sufficient for round wafers with a sharp edge. However, it has been determined that improved substrate positioning apparatus and methods are required for other generic shapes, such as a polygon, e.g., a rectangular or square substrate, as the traditional methods for detecting the position of round substrates or wafers are inadequate for substrates or wafers that are not round.

SUMMARY

One or more embodiments of the disclosure are directed to substrate processing apparatus comprising a robot arm; a three-dimensional (3D) radiation mapping device and a controller. The robot arm includes a rotational joint connecting a robot blade to a robot arm extension. The three-dimensional (3D) radiation mapping device is configured to measure a surface profile of a non-round substrate and a position of the substrate on the robot arm. The controller is in communication with the 3D radiation mapping device and the robot arm. The controller is configured to receive surface profile data from the 3D radiation mapping device and to adjust the position of the substrate on the robot arm.

Additional embodiments of the disclosure are directed to extreme ultraviolet (EUV) mask production systems. An EUV mask blank loading system is configured to receive one or more transparent, polygonal EUV mask blanks. A holding chamber provides access to a substrate handling vacuum chamber including a plurality of ports to provide access to a vacuum chamber including, a physical vapor deposition chamber, a pre-clean chamber, and a multi-cathode PVD chamber. A robot arm includes a rotational joint connecting a robot blade to a robot arm extension. The robot blade is configured to move in an x direction, a y direction and rotationally in an x-y plane. A three-dimensional (3D) radiation mapping device is configured to measure a surface profile of a non-round substrate and a position of the substrate on the robot arm. A controller is in communication with the 3D radiation mapping device and the robot arm. The controller is configured to receive surface profile data from the 3D radiation mapping device and to adjust the position of the substrate on the robot arm as the substrate is moved into at least one of the holding chamber, the physical vapor deposition chamber, the pre-clean chamber, and the multi-cathode source PVD chamber.

Further embodiments of the disclosure are directed to methods of aligning a substrate in a chamber. A substrate having a polygonal shape is moved in a chamber and placed on a robot blade of a robot arm including a rotational joint. A three-dimensional (3D) radiation mapping device is used to measure a surface profile of the substrate and a position of the substrate on the robot arm while the substrate is moving. The position of the substrate is adjusted by moving the robot blade by rotating the robot blade in an x-y plane. The substrate is placed in the chamber.

Additional embodiments of the disclosure are directed to substrate processing apparatus comprising a robot arm, a three-dimensional (3D) radiation mapping device, a target surface and a controller. The robot arm includes a robot blade to support a substrate. The three-dimensional (3D) radiation mapping device is configured to measure a surface profile of a non-round substrate and a position of the substrate on the robot arm. The target surface comprises a plurality of lift pins configured to independently move orthogonal to the target surface. The controller is in communication with the 3D radiation mapping device and the lift pins. The controller is configured to receive surface profile data from the 3D radiation mapping device and to adjust a position of the lift pins based on the surface profile data.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate embodiments of this disclosure and are therefore not to be considered limiting of its scope, for the disclosure may admit to other equally effective embodiments.

FIG. 3A is a top plan view of an alignment system in accordance with an embodiment of the disclosure;

FIG. 3B is a side view of the alignment system shown in FIG. 3A;

FIG. 3C is a top plan view of the alignment system shown in FIG. 3A after scanning and alignment of the substrate;

FIG. 3D is a side view of the alignment system shown in FIG. 3C;

DETAILED DESCRIPTION

Figure 1:
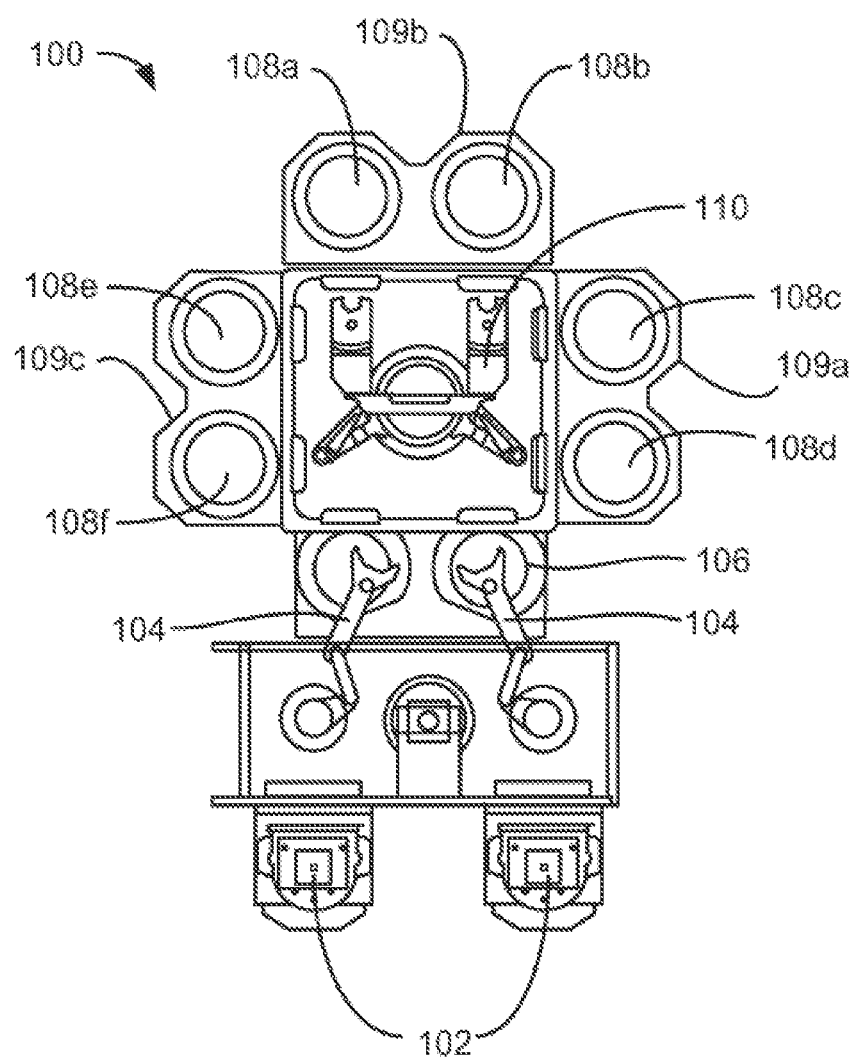
FIG. 1 is a top plan view of one embodiment of an exemplary processing tool in accordance with one or more embodiment of the disclosure.
Figure 2:
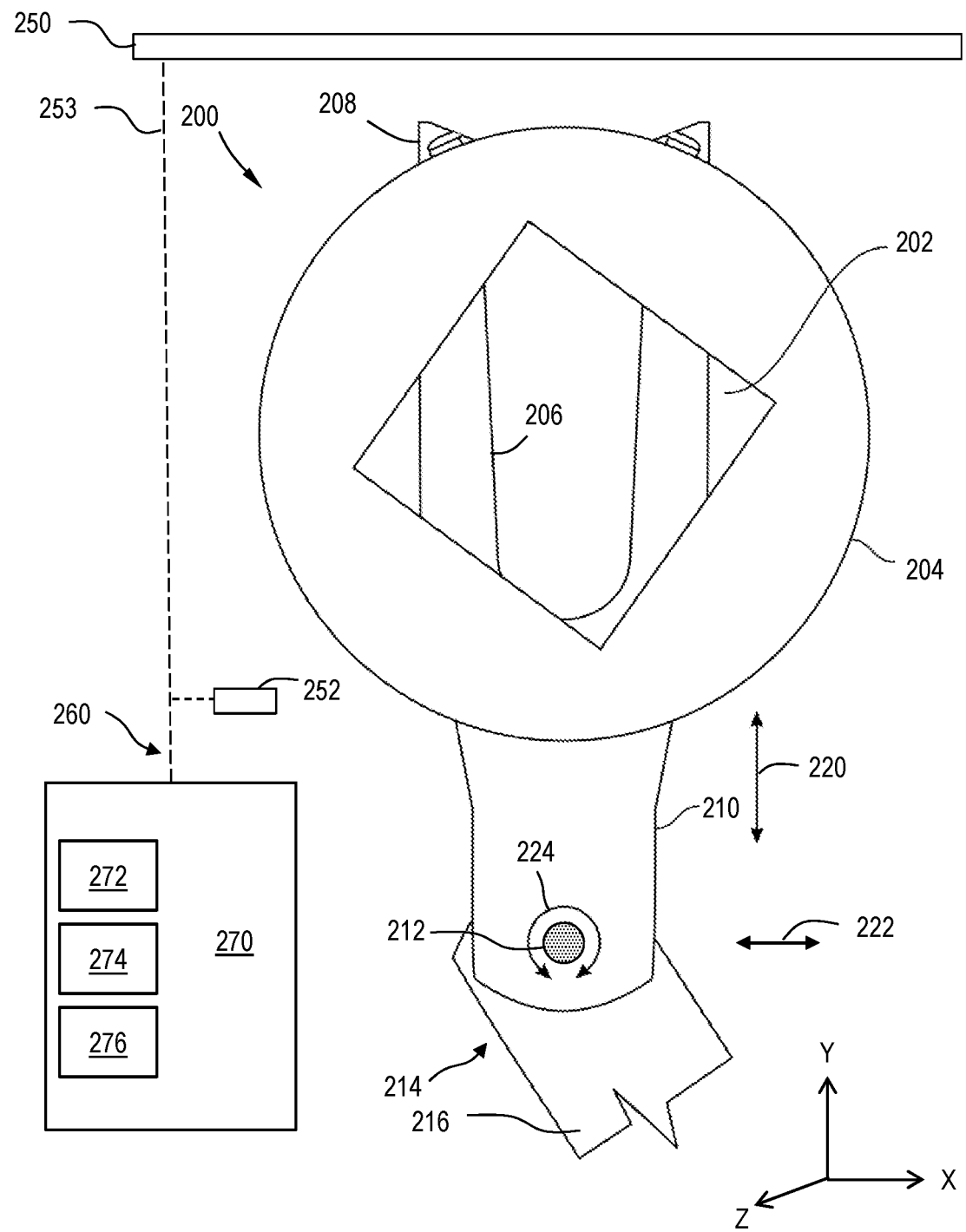
FIG. 2 is a schematic top view of a robot arm and a controller according on one or more embodiments of the disclosure.

Various embodiments in accordance with the present disclosure will now be described more fully hereinafter with reference to the accompanying drawings. The workpiece aligner apparatus and methods described herein may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts with respect to the geometry and orientation of a component of a device as appearing in the figures. The terminology will include the words specifically mentioned, derivatives thereof, and words of similar meaning and/or significance.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

A "substrate" as used herein, refers to any substrate or material surface formed on a substrate upon which layer processing is performed during a fabrication process. For example, a substrate surface on which processing is performed include materials such as silicon, silicon oxide, strained silicon, silicon on insulator (SOI), carbon doped silicon oxides, amorphous silicon, doped silicon, germanium, gallium arsenide, glass, glass-ceramics, low expansion glass, ultra low expansion glass (e.g., ULE® glass available from Corning, Inc.), Zerodur® low expansion lithium aluminosilicate glass, sapphire, and any other materials such as metals, metal nitrides, metal alloys, and other conductive materials, depending on the application. Substrates include, without limitation, wafers such as semiconductor wafers and wafers made from other types of materials such as the materials listed in the previous sentence. Substrates may be exposed to a pretreatment process to polish, etch, reduce, oxidize, hydroxylate, anneal and/or bake the substrate surface. In addition to layer processing directly on the surface of the substrate itself, in the present disclosure, any of the layer processing steps disclosed may also be performed on an under-layer formed on the substrate as disclosed in more detail below, and the term "substrate surface" is intended to include such under-layer as the context indicates. Thus for example, where a layer (a layer may also be referred to a film) or partial layer has been deposited onto a substrate surface, the exposed surface of the newly deposited layer becomes the substrate surface.

FIG. 1 shows a top plan view of one embodiment of a processing tool or system 100 used for processing substrates, including deposition (e.g., chemical vapor deposition, physical vapor deposition, and atomic layer deposition), etching, heating, thermal processing, baking, and/or curing according to one or more embodiments of the disclosure. In the figure, a pair of FOUPs (front opening unified pods) 102 supply substrates (e.g., specified diameter semiconductor wafers) that may be received by first robot arms 104 and placed into a low-pressure holding chamber or holding area (also called a load-lock chamber), which will be referred to herein as a holding chamber 106 before being placed into one of the substrate processing sections 108a-f of the process chambers 109a-c. As used herein, a holding chamber 106 is distinguished from process chambers in that a holding chamber is a chamber in which a substrate to be processed is placed before being moved to a process chamber where one or more processes are conducted. A second robotic arm 110 may be used to transport the substrates from the holding chamber 106 to the processing chambers 109a-c and back.

The substrate processing sections 108a-f of the process chambers 109a-c may include one or more system components for depositing (e.g., by chemical vapor deposition, physical vapor deposition, and atomic layer deposition), annealing, heating, thermal processing, curing and/or etching substrates or layers thereon. Thus, the chambers 109a-c may be any of a chemical vapor deposition (CVD) chamber, a physical vapor deposition (PVD) chamber, an atomic layer deposition (ALD) chamber, a flowable chemical vapor deposition (FCVD) chamber, a plasma enhanced chemical vapor deposition (PECVD) chamber, an annealing chamber, a thermal processing chamber, a rapid thermal processing (RTP) chamber, a curing chamber, an etching chamber, or a plasma etching chamber. This list of chambers is exemplary only and non-limiting. Exemplary layers may be flowable dielectrics, multilayer reflective stacks, or absorber layers, but many types of layers may be formed or processed with the processing tool. In one configuration, two pairs of the processing sections of the processing chamber (e.g., 108*c-d* and 108*e-f*) may be used to deposit the material on the substrate, and the third pair of processing sections (e.g., 108*a-b*) may be used to anneal the deposited material. In another configuration, the two pairs of the processing sections (e.g., 108*c-d* and 108*e-f*) may be configured to both deposit and anneal a layer on the substrate, while the third pair of processing sections (e.g., 108*a-b*) may be used for UV or E-beam curing of the deposited layer. In still another configuration, all three pairs of processing sections (e.g., 108*a-f*) may be configured to deposit and cure a layer on the substrate or etch features into a deposited layer.

In yet another configuration, two pairs of processing sections (e.g., 108*c-d* and 108*e-f*) may be used for both deposition and UV or E-beam curing of the layer, while a third pair of processing sections (e.g. 108*a-b*) may be used for annealing the layer. In addition, one or more of the processing sections 108*a-f* may be configured as a treatment chamber and may be a wet or dry treatment chamber. These process chambers may include heating the layer in an atmosphere that includes moisture. Thus, embodiments of system 100 may include wet treatment processing sections 108 *a-b* and anneal processing sections 108*c-d* to perform both wet and dry anneals on the deposited layer. It will be appreciated that additional configurations of deposition, etching, annealing, and curing chambers for layers are contemplated by system 100. In some embodiments, the processing sections are arranged or configured as tandem processing regions or chambers.

In view of the foregoing, an advantage of one or more embodiments of the present disclosure is that a problem with current substrate position detection and alignment apparatus useful for round substrates but not for non-round substrates is solved by providing a system that detects the position of a non-round substrate on a robot blade and align the substrate while the robot blade is loading the substrate into a chamber. According to one or more embodiments, as used herein, "non-round" refers to shape that is not a circle and includes a square, a rectangle, a triangle, a hexagon, a polygon, a rhombus, and a parallelogram.

Providing an apparatus that accurately positions non-round substrates such as polygonal substrates is very beneficial in the manufacture of elements for extreme ultraviolet lithography (EUV), also known as soft x-ray projection lithography. EUV has begun to replace deep ultraviolet lithography for the manufacture of 0.13 micron, and smaller, minimum feature size semiconductor devices. EUV systems operate by reflection instead of transmission of light. Through the use of a series of mirrors, or lens elements, and a reflective element, or mask blank, coated with a non-reflective absorber mask pattern, patterned actinic light is reflected onto a resist-coated semiconductor wafer.

Conventional EUV blank processes may include, for example, a 152 mm×152 mm blank reticle being placed into a coating tool to apply various coatings. As configured, the square reticle is sandwiched within a carrier assembly (e.g., a 300 mm carrier assembly) to enable the reticle to be transferred through the coating tool like a 300 mm wafer. The carrier assembly may include a carrier base, the reticle blank, and a carrier shield. During manufacture of a reticle, the carrier assembly may be aligned during the manufacturing process. The apparatus and methods disclosed herein are useful in a variety of semiconductor processing chambers, system and methods, for example, in deposition and etch processes, wherein it is critical to detect and monitor an exact position of the wafer inside a chamber, as position information directly affects process outcome. For example, placement of certain conducting paths, or etching in multiple chambers depend on capability of repeatable and exact placement of wafer in a chamber.

Referring now to FIGS. 2 and 3A-D, according to one or more embodiments of the disclosure, a substrate processing apparatus 200 for processing a polygonal substrate 202 is provided. In some embodiments, processing the polygonal substrate 202 involves utilizing a carrier 204 that supports the substrate. In one example, the carrier 204 is a carrier assembly, and the substrate 202 is an EUV reticle blank. The first robot arms 104 and second robot arms 110 are configured as in the exemplary embodiment shown in FIG. 2. In other embodiments, the substrate 202 is supported directly on a robot blade (end effector 206) of a robot arm 214, the robot blade (end effector 206) having a distal end 208 and a proximal end 210. The robot arm 214 further includes a rotational joint 212 connecting the robot blade (end effector 206) to a robot arm extension 216. The robot blade (end effector 206) move in the X-Y plane as shown by the X-Y axis in FIG. 2. Thus, the robot blade (end effector 206) moves back and forth in the Y direction as shown by arrow 220 and back and forth in the X direction as shown by arrow 222. Furthermore, the robot blade (end effector 206) moves rotationally about axis Z as shown by arrow 224. Motion is controlled by common drive trains comprising one or more of electric motors, transmissions (e.g., a lead screw), belts and pulleys, linear and rotary bearings and mechanical parts.

The robot arm 214 comprising the robot blade (end effector 206) and the robot arm extension 216 are part of the processing tool shown in FIG. 1 and substituted for the first robot arms 104 shown in FIG. 1 to unload the substrate 202 from front opening unified pods 102 and load the substrate 202 to a holding chamber 106. Likewise, the robot arm 214 comprising the robot blade (end effector 206) and the robot arm extension 216 are utilized as the second robot arms 110 in FIG. 1 to unload the substrate 202 from the holding chamber 106 and load the substrate 202 to one of the processing areas 108*a-f* within process chambers 109*a-c*.

Still referring to FIGS. 2 and 3A-D, The apparatus 200 includes a three-dimensional (3D) radiation mapping device 260 configured to measure the surface profile of a non-round substrate, for example, a polygonal substrate, and in some embodiments, a polygonal transparent substrate. The three-dimensional radiation mapping device 260 comprises a radiation source 250 that scans the substrate 202 and is in communication with a controller 270. The three-dimensional radiation mapping device further comprises a radiation sensor 252 that senses radiation 255 that is either transmitted through the substrate 202 or reflected from the substrate 202. In some embodiments, the substrate is transparent to the wavelength of radiation 255 emitted by the radiation source 250. In such embodiments, the radiation sensor 252 is positioned opposite the radiation source 250 to detect radiation transmitted through the transparent substrate 202. In other embodiments, such as the embodiments shown in FIGS. 3A-D, the radiation 255 is reflected from the substrate 202. In some embodiments, the radiation source 250 comprises a laser source and the radiation sensor comprises a laser sensor that detects laser radiation. According to one or more embodiments, laser sensors are used for detecting presence of a non-round substrate based on position or light intensity. Benefits of a laser sensor include long range, a visible beam spot and precise detection.

FIG. 3A shows a top plan view of the apparatus 200, showing a substrate 202 that is rectangular in shape having a width 202a and a length 202b. As seen in FIG. 3A, the substrate is not aligned in the X-Y plane. FIG. 3B shows as a side view of the apparatus 200 with the radiation source 250 emitting radiation 255 that is sensed by the radiation sensor 252 reflected from the substrate 202. In FIG. 3C, position of the substrate 202 has been corrected by rotating the substrate about the rotational joint 212 in the direction of arrow 224. The radiation source 250 and the radiation sensor 252 are shown as having moved from the right side of the substrate 202 as shown in FIGS. 3A and 3B and past the left side of the substrate 202 as shown in FIGS. 3C and 3D.

The controller 270 controls the motion of the radiation source 250 as the radiation source 250 scans the substrate 202. The radiation source 250 and the radiation sensor 252 are mounted on a carriage (not shown) that is moved by an electric motor, a pneumatic drive or a hydraulic drive (not shown). The controller 270 sends a signal to the radiation source 250 to scan the substrate 202 and cause the radiation source 250 (and optionally the radiation sensor 252) to scan across the width or length of the substrate 202. The controller 270 includes a central processing unit 272, which is configured to receive surface profile data from the radiation sensor 252 and to calculate a profile for the polygonal substrate based upon the surface profile data. In one or more embodiments, the three-dimensional radiation mapping device 260 is configured to measure the surface profile of a polygonal substrate while the substrate 202 is being loaded into a chamber with the substrate 202 on the robot blade. Stated another way, the three-dimensional radiation mapping device 260 measures the surface profile of a polygonal substrate while the substrate is in motion, that is, while the robot arm 214 is moving the substrate 202 into a chamber, such as a holding chamber or a processing chamber. Thus, the three-dimensional radiation mapping device measures the surface profile of a polygonal substrate 202 in-situ during movement of the substrate 202 into the chamber and dynamically adjusts the position of the substrate 202 by making adjustments to the substrate position in one or more of the X axis, the Y axis or rotation in the X-Y plane.

Figure 5:
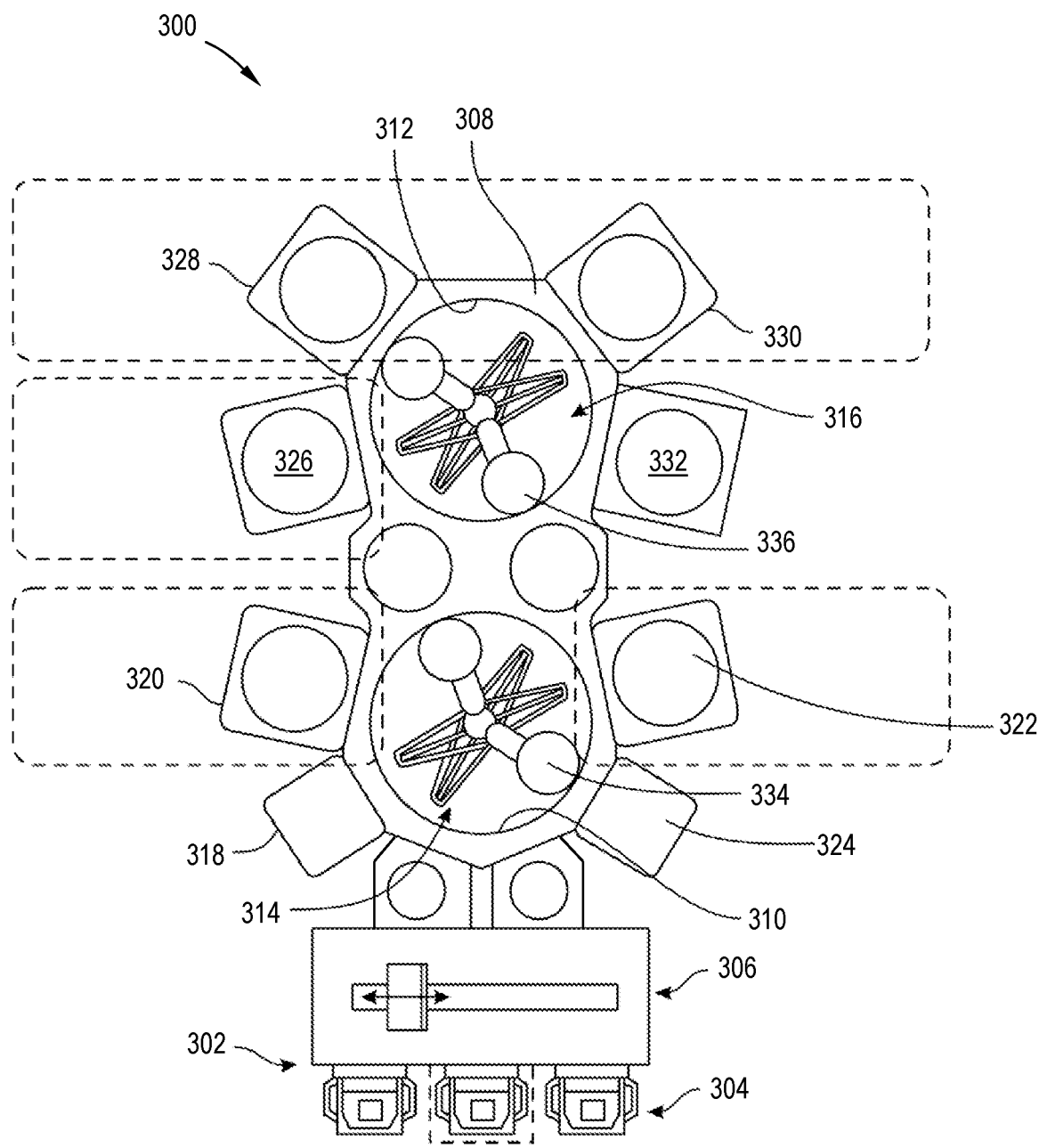
FIG. 5 is a top view of an exemplary substrate processing system in accordance with certain aspects of the present disclosure.

The controller 270, including the central processing unit (CPU) 272, a memory 274 and support circuits 276, is coupled to the radiation source 250 and the radiation sensor 252 by communication link 253 to facilitate control of loading of a substrate, unloading of a substrate and alignment of a substrate placed in a chamber. The memory 274 is any computer-readable medium, such as random access memory (RAM), read only memory (ROM), floppy disk, hard disk, or any other form of digital storage, local or remote to the apparatus or CPU 272. The support circuits 276 are coupled to the CPU 272 for supporting the CPU 272 in a conventional manner. In some embodiments, these circuits include cache, power supplies, clock circuits, input/output circuitry and subsystem, and the like. A software routine or a series of program instructions stored in the memory 274, when executed by the CPU 272, causes the substrate 202 to be loaded by the robot arm, cause the three-dimensional (3D) radiation mapping device 260 to measure the surface profile of the non-round substrate, and then cause the robot arm 214 and robot blade (end effector 206) to adjust the position of the substrate 202 in one or more of the x-axis, y-axis or rotation in the x-y plane. Thus, the controller 270 controls rotation of the robot blade (end effector 206) and controls movement of the robot blade (end effector 206) to load a workpiece in the desired position. In some embodiments, rotation of the robot blade (end effector 206) and movement of the robot blade (end effector 206) may be controlled by a single controller 270. When used in a processing tool 100 as shown in FIG. 1 or an EUV mask blank production system 300 as shown in FIG. 5, the EUV mask production system 300 or the processing tool or system 100 and the robot arm 214 and robot blade may be controlled by the single controller 270, or alternatively there may be separate controllers.

In some embodiments the three-dimensional radiation mapping device 260 utilizes laser radiation. In one or more embodiments, laser radiation includes the ultraviolet, visible, and infrared regions of the spectrum. In some embodiments, ultraviolet radiation for lasers consists of wavelengths between 180 and 400 nm. In some embodiments, the visible region consists of radiation with wavelengths between 400 and 700 nm. In some embodiments, the infrared region of the spectrum consists of radiation with wavelengths between 700 nm and 1 mm.

Thus, according to one or more embodiments, three-dimensional radiation mapping device 260 comprises a three-dimensional laser mapping device or a three-dimensional laser scanning device. The three-dimensional laser mapping device is configured to measure the surface profile of a polygonal substrate while the substrate is in motion or moving from one location to another in a substrate processing tool, for example, such as the substrate processing tool shown in FIG. 1, and more specifically, while the substrate 202 is being moved into a chamber such as a holding chamber or processing chamber. According to one or more embodiments, the three-dimensional laser mapping device is configured to measure alignment in an x-y plane as well as rotation in the x-y plane, around the x axis, the y axis or a z axis, the z axis being orthogonal to the x-y plane. As used herein, the x-y plane generally refers to a plane substantially parallel to the flat surface of a substrate, for example, as in the x-y plane of a Cartesian coordinate system.

The three-dimensional laser mapping device 260 may be a laser surface profilometer or any type of laser mapping or scanning device capable of obtaining a 3D profile of a substrate. The 3D laser mapping device is configured to measure and map the surface profile of a polygonal substrate, and in some embodiments, a transparent substrate. As used herein, "surface profile" means the topography of the substrate, including any position variation of the substrate in the x, y and z planes, as well as any rotation in the x-y axis or around the x, y and z axes.

In an embodiment, the 3D laser scanning apparatus may be configured to capture any variation of the substrate position in the x-y plane along the x axis, the y-axis and to detect any rotation in the x-y plane. In an embodiment, the substrate is comprised of a transparent material.

Figure 4A:
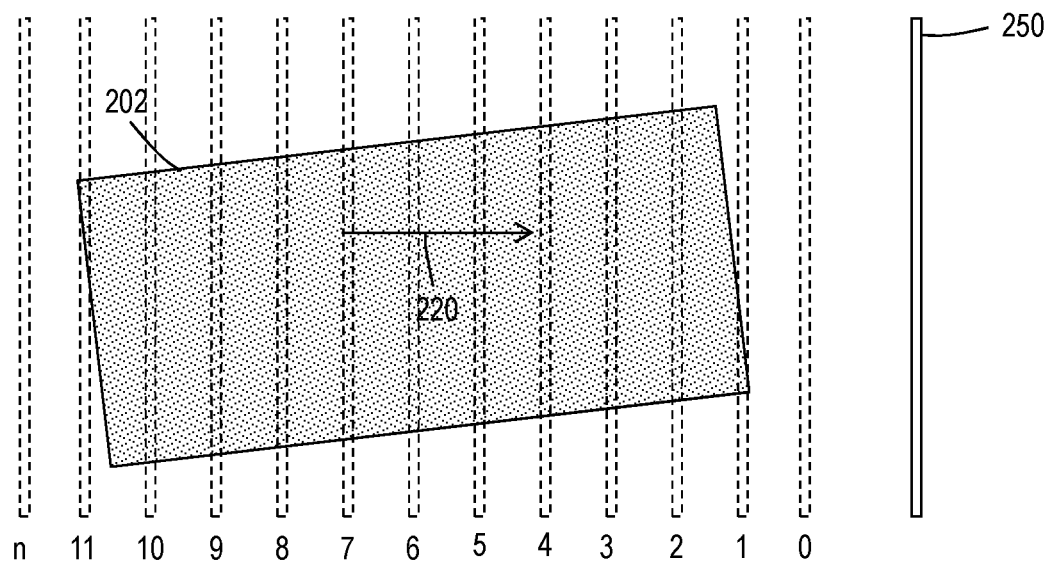
FIG. 4A depicts a map of a profile of a substrate scanned in discrete segments as a function of time according on one or more embodiments of the disclosure.
Figure 4B:
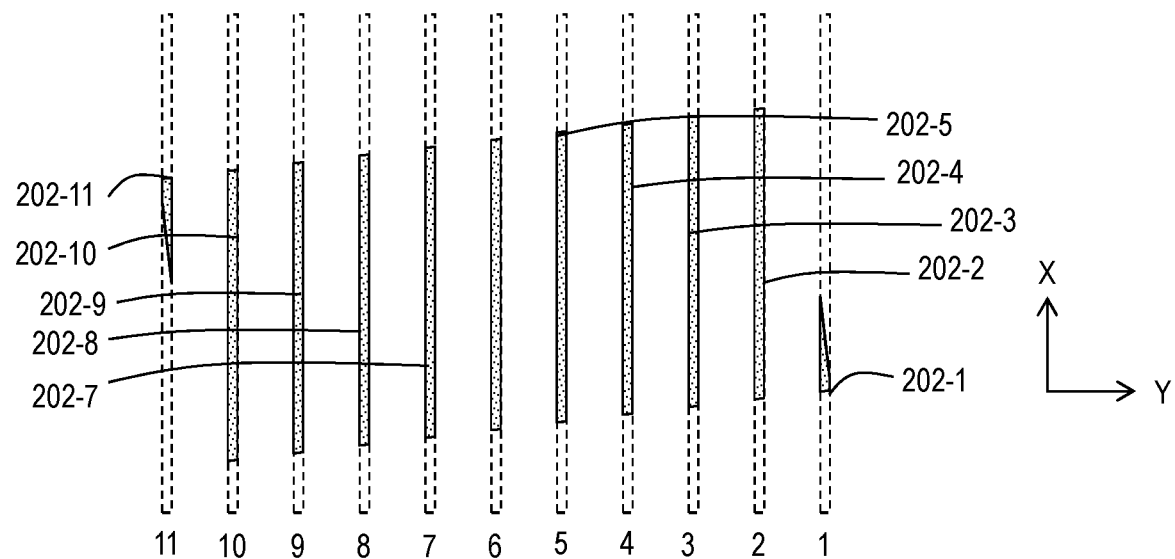
FIG. 4B depicts the map of the profile of the substrate shown in FIG. 4A.

Referring now to FIGS. 4A and 4B, a 3D profile of the substrate scanned according to one or more embodiments of the disclosure includes comprehensive information about position (eccentricity, or offset in x-y plane). FIG. 4A is a top plan view of a radiation source 250 configured to obtain a 3D profile of the substrate 202 moving in direction of arrow 220. Each of the dotted segments 0, 1, 2, 3, 4, 5, 6, 7, 8, 9, 10, 11, n, with n being any number of scanned profiles is obtained by a radiation sensor (not shown) and then transmitted to the controller 270. In FIG. 4A, which is exemplary only, 11 scanned segments are obtained by the system. In FIG. 4B, a digital map of the scanned segments 0, 1, 2, 3, 4, 5, 6, 7, 8, 9, 10, 11 reproduced by the CPU 272 of the controller 270. The controller 270 processes the digital map and then sends control signals to the robot arm to adjust the position of the substrate to a desired position.

According to one or more embodiments, the 3-D laser mapping device comprises a line-laser scanner or an array of laser point scanners that scan the substrate as the robot arm moves the substrate, for example into a holding chamber or from the holding chamber and into a processing chamber. A line laser scanner in some embodiments includes a laser beam that is enlarged in one dimension by an optical lens (e.g., a cylindrical lens assembly). The line laser is projected onto the target substrate and the diffusive reflected light from the target is directed through an optical system to a matrix of sensors. Based on the relative location of the reflected light received by the sensors, topology of the target is digitally regenerated. Such measurement is also referred to as optical triangulation for measuring distance. Such laser source, for example, is a class 2, 405 nm (blue) laser that is extended to a line and triggered at a rate relevant to the speed of the moving substrate below the sensor. A plurality of line profiles are processed by the CPU to create 3D map of the actual position of the substrate. The memory of the controller stores a desired position where the substrate is supposed to be placed, and an exact actual position versus a desired position is quantified. This information, namely, the actual position versus the desired position is then processed by the CPU and used to correct substrate placement in the chamber. The controller sends a control signal to the robot arm to adjust the position of the substrate before it is placed in the chamber. The robot arm is instructed by the CPU to adjust position in the x axis, the y axis or rotation of the substrate in the x-y plane. Therefore, there will be no need to place the substrate off-center and then physically move it to adjust the position.

Reconstructing a digital map of the substrate as the substrate is being moved into a chamber (or moved inside the chamber) for the purpose of accurate placement does not necessarily require a high resolution imaging system or charge coupled device (CCD) camera. A CCD is also incapable of capturing a transparent substrate (e.g., glass, quartz, sapphire). According to one or more embodiments, a set of linear laser sensors are utilized. Alternatively, in some embodiments, sensor heads working based on triangulation (shift in reflected light) are used to detect thickness, to reconstruct a 3D map of the substrate position. Based on the shift in the reflection position, a 'thickness' is inferred. This is a concept also called triangulation of light. The selection of measurement wavelength depends on the transmission spectrum of the substrate. For example, a quartz substrate is opaque to light with a wavelength greater than about 4 microns. The different wavelength laser beams are used for different measurement types (e.g., transmission, reflection). For example, quartz would provide about 8% reflection of red laser that would be adequate for the sensor to detect the substrate. By processing the data collected from the set of sensors, it is possible to generate a digital 3D shape representing the substrate and also generate a position of the substrate relative to a target position or point in the chamber. In some embodiments, processing data from the set of sensors generates a position of the substrate relative to a target position or point on the robot arm, such as the rotational joint 212. This position information is used to compensate for off-centricity or rotational disparities in the x-y plane by correcting robot arm motion. This method could be a regular part of in-situ monitoring of the substrate handling and transfer for any shape of substrates, in particular non-round substrates. The method could be used in a transfer chamber such as a FOUP, a holding chamber or a load lock chamber or in a process chamber. In either case, only a linear transparent path or reflective from the sensor to the wafer area is needed. Therefore, in some embodiments this method is implemented for existing transfer chambers, orienters, or process chambers with a quartz window.

Another aspect of the disclosure pertains to a method of aligning a substrate in a chamber comprising moving a substrate having a polygonal shape in a chamber, the substrate placed on a robot blade of a robot arm including a rotational joint; using a three-dimensional (3D) radiation mapping device to measure a surface profile of the substrate and a position of the substrate relative to the robot arm (or to the target position) while the substrate is moving; and adjusting the position of the substrate by moving the robot blade by rotating the robot blade in an x-y plane; and placing the substrate in the chamber. In one or more embodiments, the substrate is placed in a desired position in the chamber. The desired position may be a predetermined position, which has been determined in advanced and stored in a memory of a controller, such as the memory described above with respect to the controller 270.

According to some embodiments of the method, the method comprises obtaining surface profile data and providing a controller in communication with the 3D radiation mapping device and the robot arm, the controller configured to receive surface profile data from the 3D radiation mapping device and to adjust the position of the substrate relative to the target position (e.g., substrate support). The controller compares the actual position of the substrate as the robot arm is moving the substrate into a process chamber and compares the actual position with the desired position. In some embodiments, the method comprises storing the surface profile data in a memory. According to some embodiments of the method, the 3D mapping device comprises a laser source and a laser sensor in communication with the controller. In one or more embodiments, the 3D mapping device generates a digital 3D shape representing the substrate as well as a position of the substrate relative to a position or point on the robot arm.

As mentioned above, the apparatus and method are beneficial in the manufacture of EUV devices such as EUV masks. FIG. 5 depicts an EUV mask production system 300, which includes the apparatus 200 for processing a polygonal substrate, for example, a polygonal transparent substrate comprised of quartz, silica, glass or ultra-low expansion glass as described herein according to one or more embodiments. The EUV mask production system 300 may include a mask blank loading and carrier handling system 302 configured to receive one or more mask blanks 304 that are polygonal in shape or polygonal in shape and transparent. A holding chamber 306 provides access to a substrate handling vacuum chamber 308. In the embodiment shown, the substrate handling vacuum chamber 308 contains two vacuum chambers, e.g., a first vacuum chamber 310 and a second vacuum chamber 312. Within the first vacuum chamber 310 is a first substrate handling system 314, and in the second vacuum chamber 312 is a second substrate handling system 316.

The substrate handling vacuum chamber 308 may have a plurality of ports around its periphery for attachment of various other systems or chambers and to provide access to these various other systems or chambers. In this non-limiting embodiment, the first vacuum chamber 310 has a degas chamber 318, a first physical vapor deposition chamber 320, a second physical vapor deposition (PVD) chamber 322, and a pre-clean chamber 324. Furthermore, the second vacuum chamber 312 may include a first multi-cathode PVD chamber 326, a flowable chemical vapor deposition (FCVD) chamber 328, a cure chamber 330, and a second multi-cathode PVD chamber 332 connected to the second vacuum chamber.

The first substrate handling system 314 is capable of moving substrates, such as a substrate 334, among the holding chamber 306 and the various chambers around the periphery of the first vacuum chamber 310 and through slit valves in a continuous vacuum. The second substrate handling system 316 is capable of moving substrates, such as a substrate 336, around the second vacuum chamber 312, while maintaining the substrates in a continuous vacuum. The integrated EUV mask production system 300 may operate with a reticle processing system. The apparatus 200 for processing a polygonal substrate is utilized adjacent or near the carrier handling system 302. In particular, the three-dimensional (3D) radiation mapping device 260 configured to measure the surface profile of a non-round substrate is used to accurately place the substrates 334 and 336 as described with respect to FIGS. 2 and 3A-B herein in the various chambers, namely the degas chamber 318, the first physical vapor deposition chamber 320, the second physical vapor deposition chamber 322, the pre-clean chamber 324, the first multi-cathode PVD chamber 326, the flowable chemical vapor deposition (FCVD) chamber 328, the cure chamber 330, and the second multi-cathode PVD chamber 332. Accurate placement of the polygonal substrate in one or more of these chambers is critical to meeting production requirements and accurate fabrication of EUV masks and EUV reticles. Existing systems and apparatus are not capable of accurately detecting position and placing non-round substrates, particularly, detecting the position of the substrate relative to a position or point on the robot arm while the substrate is moving, such as when the polygonal substrate is on a robot blade of a robot arm and being moved into a holding chamber or process chamber.

The various chambers of the integrated EUV mask production system 300 are configured to change the absorption/reflection properties of the substrate. For example, one or more of the processes change the blank from bare glass to various states as layers (reflection layers) are added. Alignment of a substrate before entering a processing chamber is performed in some embodiments using a different radiation source/sensor configuration than after processing. In some embodiments, the integrated mask production system 300 includes more than one type of radiation source and/or more than one type of sensor. The radiation sources and/or sensors are operated separately or at the same time. For example, the radiation source is configured to provide radiation at two distinct wavelengths which are measured by the sensor (either together or separately). A substrate is measured using both wavelengths at the same time, where only one of the wavelengths is evaluated for alignment purposes. In some embodiments, there is more than one type of sensor. For example, a system may include a transmission sensor and a reflectance sensor and the substrate may be measured by transmission before processing (e.g., formation of a Bragg reflector) and by reflectance after processing.

Figure 6A:
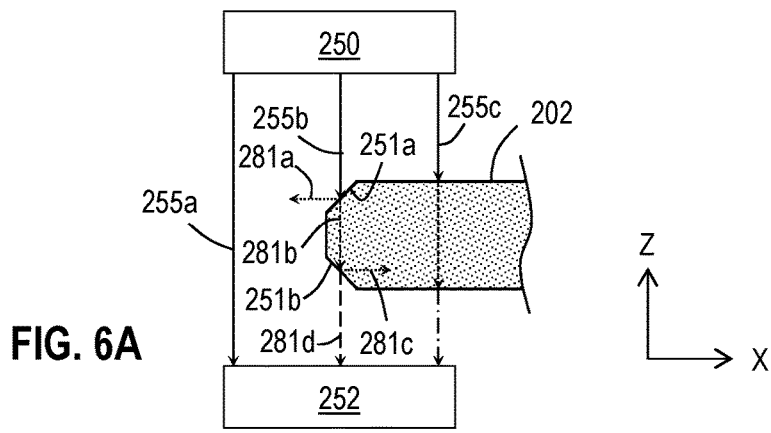
FIG. 6A shows a partial schematic side view of light transmitted through a substrate with beveled edges according to one or more embodiment of the disclosure.

In some embodiments, the substrate has one or more beveled edges which may alter the transmission/reflection of light from the radiation source. FIG. 6A illustrates a partial side view of a substrate 202 having beveled edges 251a, 251b with multiple radiation vectors 255a, 255b, 255c illustrating the attenuation of the transmission of the radiation. The first radiation vector 255a does not encounter the substrate 202, providing a maximum transmission signal at the radiation sensor 252.

The second radiation vector 255b passes through the beveled edges 251a, 251b of the substrate 202. At the first beveled edges 251a, a portion 281a of the incident radiation is reflected or scattered so that a reduced amount of radiation 28 lb passes through the body of the substrate 202. At the second beveled edge 25 lb, a portion 281c of the radiation 28 lb is reflected or scattered so that a further reduced amount of radiation 281d is measured at the sensor 252. The third radiation vector 255c passes through the body of the substrate 202 resulting in maximum absorbance/minimum transmittance of the radiation measured at sensor 252.

Figure 6B:
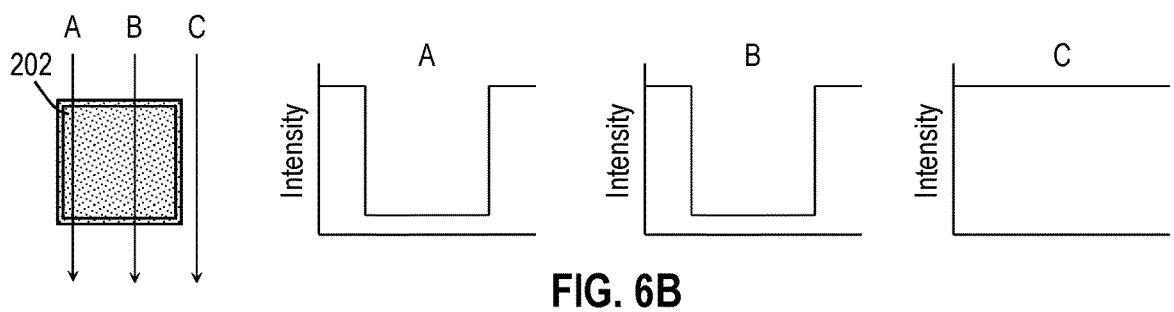
FIGS. 6B through 6D illustrate transmission profiles of the embodiment of FIG. 6A under different alignment conditions.
Figure 6C:
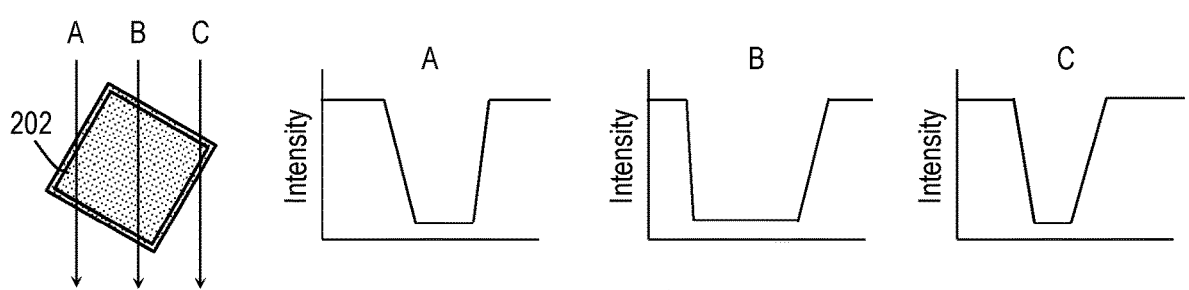
Figure 6D:
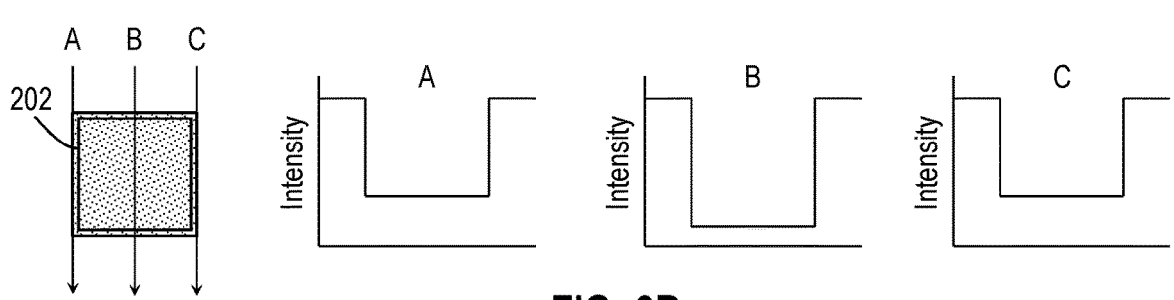

FIGS. 6B through 6D illustrate measurements along three vectors A, B, C for substrates 202 at different centered or rotational positions. In FIG. 6B, the substrate 202 is off-center and aligned with the measurement vectors A, B, C. The transmission intensity measured at vector A and B will have a square-wave shaped result. The illustrated embodiment is idealized and the skilled artisan will recognize that the transmittance at the beveled portions of the substrate may cause non-linearity of the signal response. The intensity measured along vector C remains constant with a maximum transmission value measured at the sensor indicating that the substrate 202 was not present along vector C.

FIG. 6C illustrates an embodiment in which the substrate 202 is off-center and mis-aligned with the measurement vectors A, B, C. The transmission intensity response for each of the vectors will be different because the length of the substrate portion passing along the vectors is different. The angle and length of the sloped portions of the transmission profile at the different vectors provide a measurement of the degree of rotation of the substrate.

FIG. 6D illustrates an embodiment in which the substrate 202 is centered and aligned with the measurement vectors A, B, C. The transmission intensity response along each of the vectors will have similar shapes. The difference in intensity measurements for vectors A and C from minimum to maximum will be less than the difference observed for vector B. This occurs because vectors A and C are positioned along the beveled edges of the substrate. The intensity response curves illustrated in FIGS. 6B through 6D are idealized for illustrative and descriptive purposes. The skilled artisan will recognize that the beveled edges of the substrate and variations in incident radiation intensity along any given vector may cause changes to the idealized signal response. The scattering or reflecting effect of the beveled edges 251a, 251b may cause a non-linearity of the transmission responses. The non-linearity of the transmitted radiation provides a measurement of the skew angle because the length of the beveled edge along a particular vector will be proportional to the angle of rotation of the substrate relative to the vector.

In each case illustrated in FIGS. 6B through 6D, or in other configurations, the individual sensor outputs from the vectors are "stitched" together to form a three dimensional map of the substrate alignment. In some embodiments, this is done by scanning (measuring) slices (vectors) in the x-direction and/or the y-direction while moving the substrate in the y-direction.

Figure 7:
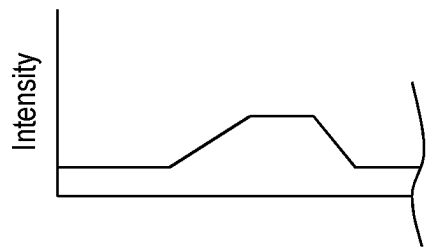
FIG. 7 illustrates an exemplary composite reflectance measurement of the substrate aligned according to FIG. 6C.

The embodiments illustrated in FIGS. 6B through 6D are indicative of the transmission profiles of the incident radiation from the radiation source 250 through the substrate 202. The skilled artisan will recognize that the absorption (the reciprocal of the transmittance) of the incident radiation could be measured. In some embodiments, the reflectance of the incident radiation is measured using a sensor positioned above the substrate, as illustrated in FIGS. 3B and 3D. FIG. 7 illustrates an exemplary reflectance curve for the substrate position shown in FIG. 6C. The skewed angle of the substrate, along with the angle/length of the beveled edges 251a, 251b will change the shape of the intensity profile. The relative slopes and lengths of the angled portions of the intensity profile provides a measure of the center and/or alignment of the substrate.

Figure 8A:
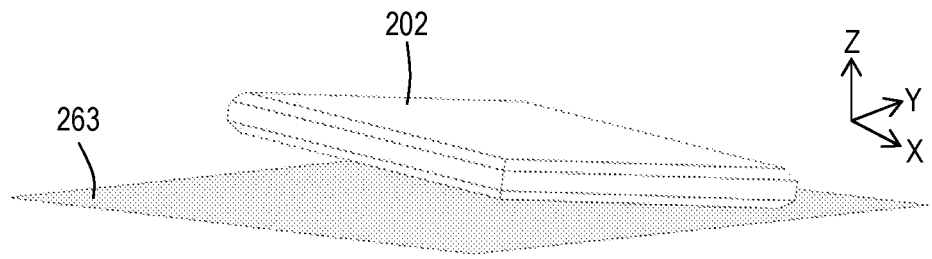
FIG. 8A illustrates a skewed substrate on a reference surface.
Figure 8B:
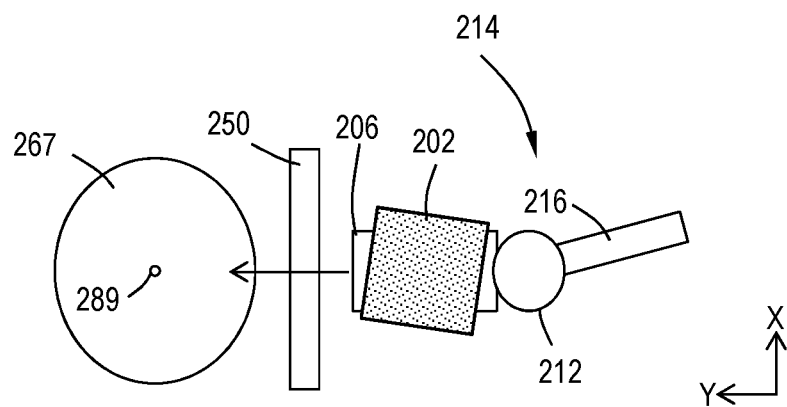
FIG. 8B illustrates a schematic representation of an alignment system using the substrate of FIG. 8A in accordance with one or more embodiment of the disclosure.
Figure 8C:
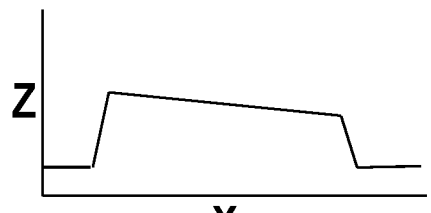
FIG. 8C illustrates an exemplary composite reflectance graph of the substrate of FIG. 8A taken along the substrate X axis.
Figure 8D:
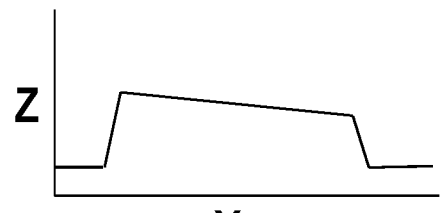
FIG. 8D illustrates an exemplary composite reflectance graph of the substrate of FIG. 8A taken along the substrate Y axis.

The profile of the substrate alignment is mapped to correct for misalignment with a supinating robot. FIG. 8A illustrates an isometric view of a substrate 202 that is skewed in both the x-z and y-z planes, relative to the illustrated reference surface 263 (also referred to as a target surface). FIG. 8B illustrates a portion of an alignment system for use with the substrate skewed according to FIG. 8A. The rotational joint 212 of this embodiment provides three degrees of freedom for movement and alignment of the substrate with the target 267. As the substrate 202 is moved past radiation source 250, the angle and position of the substrate are measured along the x-z and y-z planes. FIGS. 8C and 8D illustrate representative profiles of the substrate 202 along the x-z plane, and y-z plane, respectively. The shape of these profiles is used to determine the degree of skew in both planes.

Figure 9A:
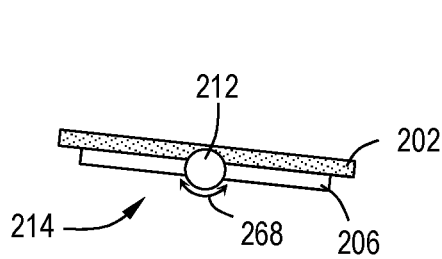
FIG. 9A shows a partial schematic view of an alignment system in accordance with one or more embodiment of the disclosure.
Figure 9B:
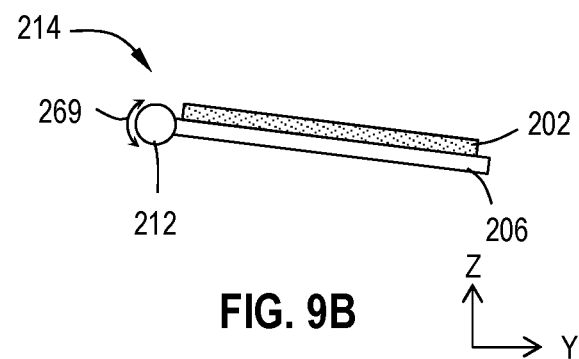
FIG. 9B shows a partial schematic view of an alignment system in accordance with one or more embodiment of the disclosure.

FIG. 9A illustrates a partial view of a robot arm 214 showing the rotational joint 212 and blade (end effector 206) viewed along the y-axis. The rotational joint 212 rotates as indicated by arrow 268 along the y-axis (extending orthogonal to the plane of the illustrated page) to move the substrate 202 and end effector (blade 206) to adjust for roll. Stated differently, the rotation joint 212 rotates as indicated by arrow 268 in the y-z plane. FIG. 9B illustrates a partial view of the robot arm 214 showing the rotation joint 212 and blade (end effector 206) viewed along the x-axis (extending orthogonal to the plane of the illustrated page). The rotational joint 212 rotates as indicated by arrow 269 along the x-axis to move the substrate 202 and blade (end effector 206) to adjust for pitch or drooping. Stated differently, the rotational joint 212 rotates as indicated by arrow 269 in the x-z plane. The combined movements illustrated in FIGS. 9A and 9B provide sufficient rotational and angular movement of the substrate 202 to align the substrate with the target surface.

Figure 10:
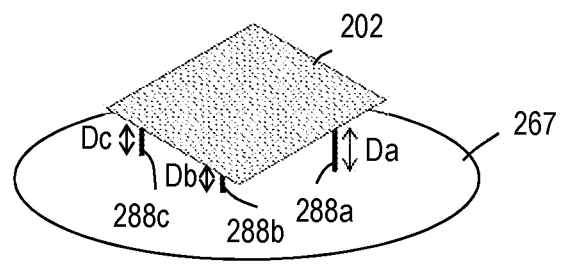
FIG. 10 shows a partial schematic view of an alignment system in accordance with one or more embodiment of the disclosure.

FIG. 10 illustrates another embodiment of the disclosure in which lift pins 288a, 288b, 288c are used to de-skew the substrate 202. The lift pins of some embodiments have independent axes to adjust the plane formed by the ends of the lift pins. The substrate alignment is measured and the lift pins 288a, 288b, 288c adjusted to match the alignment of the substrate 202. When the lift pins retract, the substrate is centered and aligned. For example, the substrate 202 illustrated in FIG. 10 is skewed according to FIG. 8A. The lift pins 288a, 288b, 288c are independently controlled to extend different distances from the surface of the target 267. In the illustration, lift pin 288a extends a distance Da, lift pin 288b extends a distance Db and lift pin 288c extends a distance Dc. The extension distances are configured so that when the substrate is lowered onto the lift pins, each of the lift pins contacts the substrate at the same time. The target 267 of some embodiments has a rotational axis 289 (as shown in FIG. 8B) which is used to rotate the substrate 202 around the z-axis (i.e., in the x-y plane). A combination of lift pins and target rotation are used to de-skew and align the substrate 202 for processing.

In some embodiments, the target surface comprises a plurality of lift pins 288a, 288b, 288c configured to independently move orthogonal to the target surface (i.e., along the z-axis). The illustrated embodiment includes three lift pins; however, more or less than three lift pins are used in one or more embodiments. In some embodiments, the controller is in communication with the 3D radiation mapping device and the lift pins. The controller is configured to receive surface profile data from the 3D radiation mapping device and to adjust the positions of one or more of the lift pins based on the surface profile data. The adjustment of the lift pins of some embodiments level the substrate relative to the target surface so that the substrate and the target surface are parallel.

In some embodiments, the lift pins are part of a lift pin assembly (not shown) that rotate around the z-axis and/or move in one or more of the x-axis or z-axis directions. In some embodiments, controller is further configured to rotate a lift pin assembly including the lift pins around an axis to align the substrate. The lift pin assembly moves the individual lift pins at the same time so that the relative distances between the lift pins remains the same. In some embodiments, the controller is further configured to move (or translate) the lift pin assembly to center the substrate relative to the target surface (i.e., movement within the x-y plane). In this manner, the substrate position and orientation are determined prior to placing the substrate on the lift pins. The lift pins are then adjusted to level the substrate and rotated and/or translated to align and position the substrate.

Figure 11:
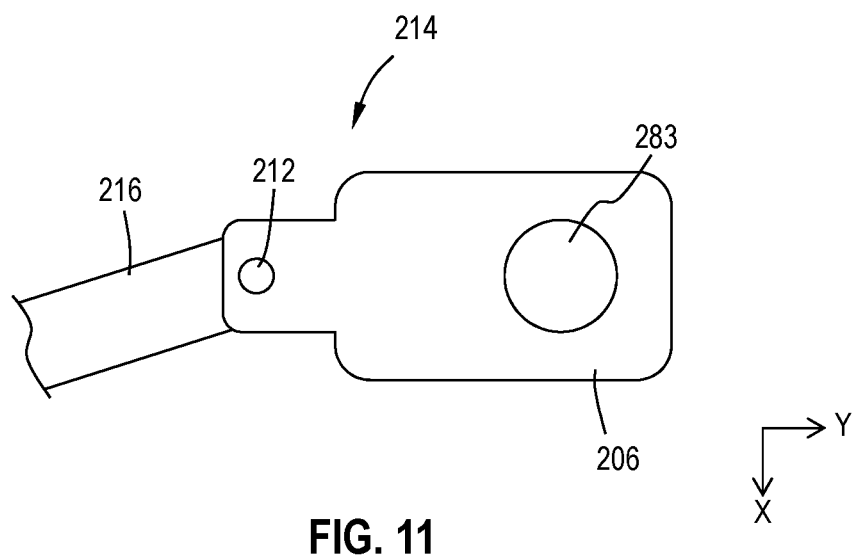
FIG. 11 shows a partial schematic view of an alignment system using a rotation axis in an end effector of a robot blade in accordance with one or more embodiment of the disclosure.

FIG. 11 shows another embodiment of a robot arm 214 which is used for substrate alignment. The robot arm 214 illustrated has an axis 283 in end effector 206 for theta (rotational) adjustment with respect to arm 214. The axis 283 illustrated has a single surface that can support the substrate and rotate about the axis 283. In some embodiments, the axis 283 in the end effector 206 comprises a lift pin type assembly with more than one contact point. In use, the axis 283 extends along the z-axis (out of the plane of the drawing page) to elevate the substrate above the end effector 206. The axis 283 is rotated and lowered to place the substrate back onto the end effector 206. In some embodiments, the substrate is positioned on the end effector 206 with the axis 283 in the elevated position and the substrate is aligned using one or more of the axis 283 or rotational joint 212. Once aligned, the substrate is then be lowered onto the end effector 206. The substrate is adjusted relative to the end effector 206 prior to loading the substrate into a processing chamber.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A substrate processing apparatus comprising:
   a robot arm including a rotational joint connecting a robot blade to a robot arm extension;
   a three-dimensional (3D) radiation mapping device configured to measure a surface profile of a non-round substrate and a position of the substrate on the robot arm;
   a controller in communication with the 3D radiation mapping device and the robot arm, the controller configured to receive surface profile data from the 3D radiation mapping device and to adjust the position of the substrate on the robot arm; and
   a target surface comprising a plurality of lift pins, the lift pins configured to independently move orthogonal to the target surface, wherein the controller is in communication with the lift pins to adjust a position of the lift pins based on the surface profile data.

2. The substrate processing apparatus of claim 1, wherein the 3D radiation mapping device comprises a 3D laser mapping device.

3. The substrate processing apparatus of claim 2, wherein the 3D laser mapping device is configured to measure the surface profile of a transparent substrate.

4. The substrate processing apparatus of claim 3, wherein the 3D laser mapping device is configured to measure the surface profile of substrate that is a square, a rectangle, a triangle, a hexagon, a polygon, a rhombus, and a parallelogram.

5. The substrate processing apparatus of claim 4, wherein the 3D laser mapping device comprises a laser source and a laser sensor.

6. The substrate processing apparatus of claim 5, further comprising a controller that controls movement of the robot arm and the robot blade is configured to move in an x direction, a y direction and rotationally in an x-y plane.

7. The substrate processing apparatus of claim 6, wherein the controller is configured to move the robot blade n one or more of in an x-direction, a y-direction, rotationally in an x-y plane, an x-z plane or a y-z plane.

8. The substrate processing apparatus of claim 7, wherein the controller is configured to measure the surface profile of a substrate while the substrate is being loaded into a chamber with the substrate on the robot blade.

9. The substrate processing apparatus of claim 1, wherein the controller is further configured to independently move the lift pins orthogonally to the target surface so that the substrate is parallel to the target surface.

10. The substrate processing apparatus of claim 9, wherein the controller is further configured to rotate a lift pin assembly including the lift pins around an axis to align the substrate, and the controller is further configured to move the lift pin assembly to center the substrate relative to the target surface.

11. An extreme ultraviolet (EUV) mask production system comprising:
    a EUV mask blank loading system configured to receive one or more transparent, polygonal EUV mask blanks;
    a holding chamber to provide access to a substrate handling vacuum chamber including a plurality of ports to provide access to a vacuum chamber including, a physical vapor deposition chamber, a pre-clean chamber, and a multi-cathode PVD chamber;
    a robot arm including a rotational joint connecting a robot blade to a robot arm extension, the robot blade configured to move in an x direction, a y direction and rotationally in an x-y plane;
    a three-dimensional (3D) radiation mapping device configured to measure a surface profile of a non-round substrate and a position of the substrate on the robot arm;
    a controller in communication with the 3D radiation mapping device and the robot arm, the controller configured to receive surface profile data from the 3D radiation mapping device and to adjust the position of the substrate on the robot arm as the substrate is moved into at least one of the holding chamber, the physical vapor deposition chamber, the preclean chamber, and the multi-cathode PVD chamber; and
    a target surface comprising a plurality of lift pins, the lift pins configured to independently move orthogonal to the target surface, wherein the controller is in communication with the lift pins and adjusts a position of the lift pins based on the surface profile data.

12. The EUV mask production system of claim 11, wherein the 3D radiation mapping device comprises a 3D laser mapping device comprising a laser source and a sensor configured to measure a surface profile of a transparent substrate.

13. The EUV mask production system of claim 12, wherein the controller is further configured to independently move the lift pins orthogonally to the target surface so that the substrate is parallel to the target surface.

14. The EUV mask production system of claim 13, wherein the controller is further configured to rotate a lift pin assembly including the lift pins around an axis to align the substrate, and the controller is further configured to move the lift pin assembly to center the substrate relative to the target surface.

15. The EUV mask production system of claim 12, further comprising a controller that controls movement of the robot arm and move the robot blade in one or more of an x-direction, a y-direction, rotationally in an x-y plane.

16. A method of aligning a substrate in a chamber comprising:
    moving a substrate having a polygonal shape in a chamber, the substrate placed on a robot blade of a robot arm including a rotational joint;
    using a three-dimensional (3D) radiation mapping device to measure a surface profile of the substrate and a position of the substrate on the robot arm while the substrate is moving to obtain surface profile data; and
    adjusting the position of the substrate by moving the robot blade by rotating the robot blade in an x-y plane; and
    placing the substrate in the chamber including a target surface comprising a plurality of lift pins, the lift pins configured to independently move orthogonal to the target surface, wherein a controller is in communication with the lift pins to adjust a position of the lift pins based on the surface profile data.

17. The method of claim 16, the controller in communication with the 3D radiation mapping device and the robot arm, the controller configured to receive surface profile data from the 3D radiation mapping device and to adjust the position of the substrate on the robot arm.

18. The method of claim 17, wherein the 3D mapping device comprises a laser source and a laser sensor in communication with the controller.

19. The method of claim 18, wherein the 3D mapping device generates a digital 3D shape representing the substrate as well as a position of the substrate relative to a position or point on the robot arm.

* * * * *